United States Patent
Yu et al.

(10) Patent No.: US 11,826,709 B2
(45) Date of Patent: Nov. 28, 2023

(54) FILTER APPARATUS FOR SEMICONDUCTOR DEVICE FABRICATION PROCESS

(71) Applicant: TAIWAN SEMICONDUCTOR MANUFACTURING COMPANY, LTD., Hsinchu (TW)

(72) Inventors: Chwen Yu, Taipei (TW); En Tian Lin, Hsinchu (TW); Chih-Chiang Tseng, Xinfeng Township (TW); Tzu-Sou Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 74 days.

(21) Appl. No.: 17/333,499

(22) Filed: May 28, 2021

(65) Prior Publication Data
US 2022/0379265 A1 Dec. 1, 2022

(51) Int. Cl.
*B01D 67/00* (2006.01)
*H01L 21/67* (2006.01)
*B01D 63/08* (2006.01)
*B01D 69/06* (2006.01)
*B01D 69/02* (2006.01)

(52) U.S. Cl.
CPC ........ *B01D 67/0034* (2013.01); *B01D 63/08* (2013.01); *B01D 67/0037* (2013.01); *B01D 67/0088* (2013.01); *B01D 69/02* (2013.01); *B01D 69/06* (2013.01); *H01L 21/67017* (2013.01); *B01D 2323/34* (2013.01); *B01D 2325/02* (2013.01); *B01D 2325/04* (2013.01)

(58) Field of Classification Search
CPC ............... B01D 67/0034; B01D 63/08; B01D 67/0037; B01D 67/0088; B01D 69/02; B01D 69/06; B01D 2323/34; B01D 2325/02; B01D 2325/04; H01L 21/67017
See application file for complete search history.

(56) References Cited

U.S. PATENT DOCUMENTS

2013/0011799 A1* 1/2013 Pullini .............. C08J 7/18
430/320
2022/0176325 A1* 6/2022 Albagli ............. B01D 61/147

OTHER PUBLICATIONS

Ramirez ert al., "Fabrication Techniques Enabling Ultrathin Nanostructured Membranes for Separations," Electrophoresis. Oct. 2017 ; 38(19): 2374-2388.*
Flamm et al, "The Design of Plasma Etchants", Plasma Chemistry and Plasma Processing, vol. 1, No. 4, 1981.*
Hiroyuki Miyazoe et al., "Highly selective dry etching of polystyrenepoly( methyl methacrylate) block copolymer by gas pulsing carbon monoxide-based plasmas," J. Phys. D: Appl. Phys. 50 204001 (2017).
Keith Morton et al., "Wafer-scale patterning of sub-40 nm diameter and high aspect ratio (> 50 : 1) silicon pillar arrays by nanoimprint and etching," Nanotechnology 19(34):345301 DOI:10.1088/0957-4484/19/34/345301 (Aug. 2008).
Chi-Ho Ng et al., "The role of PVD sputtered PTFE and Al2O3 thin films in the development of damage tolerant coating systems," J. Mater. Res. TechnoL. 9(1):675-686 (2020).

* cited by examiner

*Primary Examiner* — Krishnan S Menon
(74) *Attorney, Agent, or Firm* — Studebaker & Brackett PC

(57) ABSTRACT

A filter device includes one or more filter membranes, and a filter housing enclosing the one or more filter membranes. Each of the filter membranes includes a base membrane and a plurality of through holes.

20 Claims, 13 Drawing Sheets

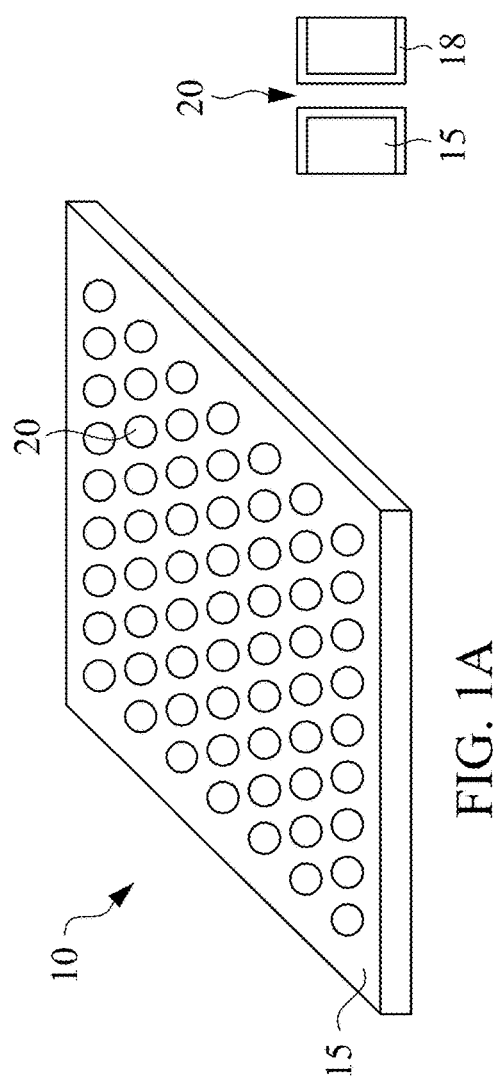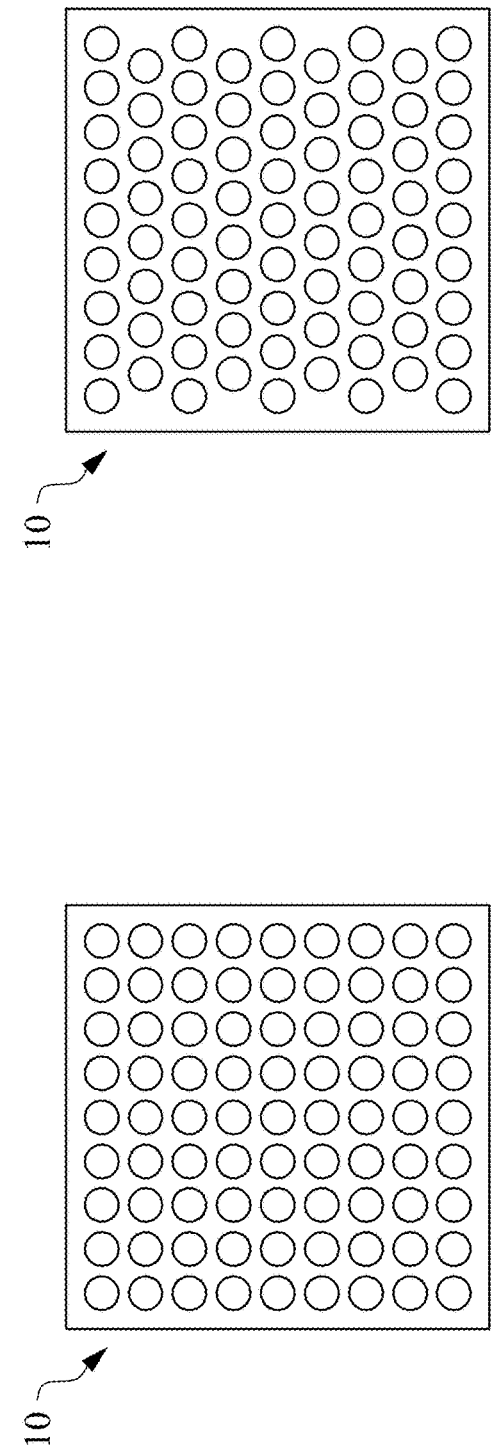

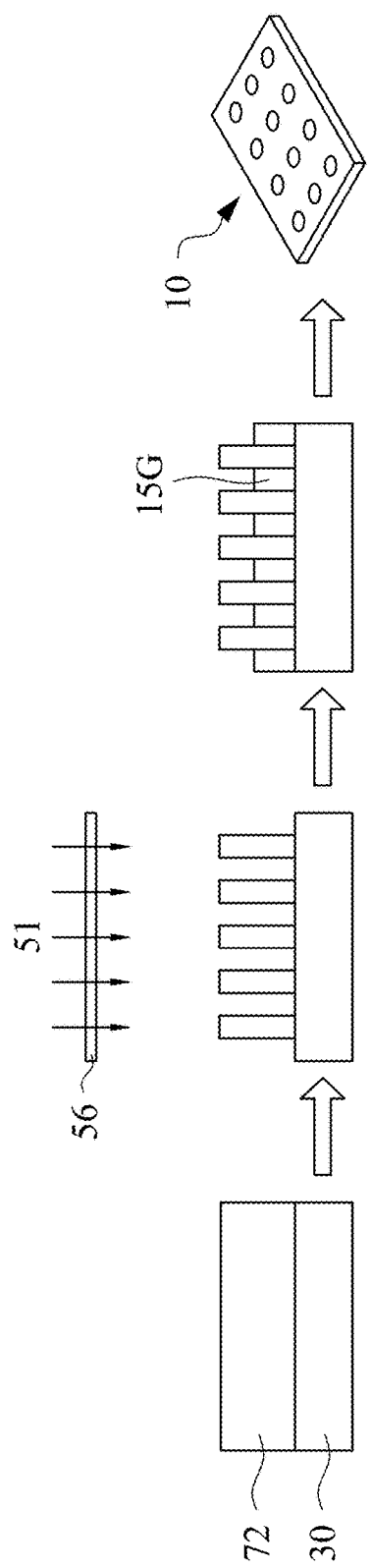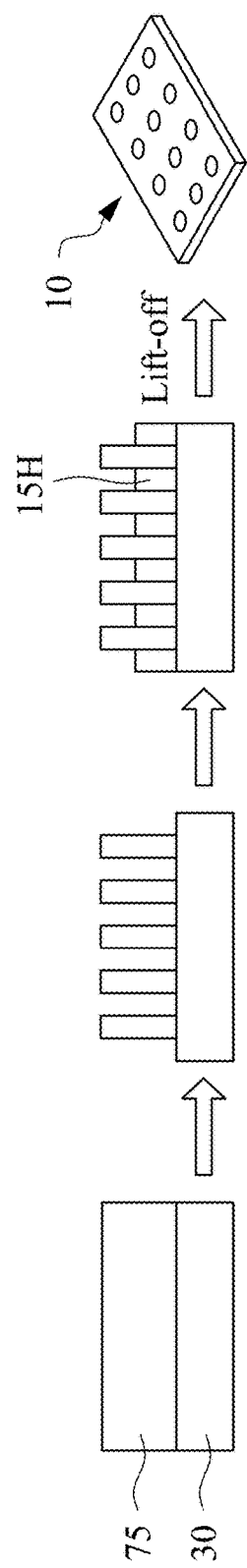

FILTER APPARATUS FOR SEMICONDUCTOR DEVICE FABRICATION PROCESS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. As pattern sizes of semiconductor devices become smaller and semiconductor devices having new structures are developed, contaminant-free or particle-free liquids have been required for fabricating integrated circuits to improve yield. Filters, in particular, point-of-use (POU) filters, are designed to remove contaminants or particles from the liquids, solutions, and/or solvents used in semiconductor integrated circuit manufacturing processes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, 1D and 1E show schematic views of filter membranes according to various embodiments of the disclosure.

FIG. 2G schematically illustrates a sequential manufacturing process of a filter membrane according to an embodiment of the disclosure.

FIG. 2H schematically illustrates a sequential manufacturing process of a filter membrane according to an embodiment of the disclosure.

DETAILED DESCRIPTION

Figure 1E:
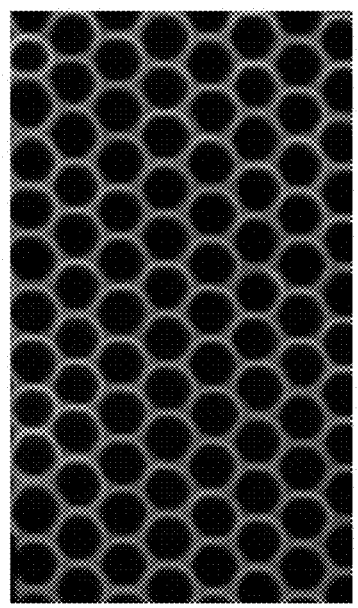

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Materials, configurations, dimensions and/or processes explained in one embodiments can be applied to other embodiments, and the detailed description thereof may be omitted.

Various fluids, liquids or solutions, such as a photoresist, a developer, a wet etchant, a cleaning solution, a slurry for chemical mechanical polishing, etc., are used in the fabrication of integrated circuits. These fluids are required to be substantially free from contamination and/or particles. Filters are used to remove the contamination and/or particles. In particular, point-of-use filters are designed as the last opportunity to remove contaminants from the fluids used in integrated circuit manufacture. A point-of-use filter processes fluid which is to be utilized immediately in a localized manufacturing step. The manufacture of integrated circuits involves multiple steps in which silicon wafers are repeatedly exposed to processes such as lithography, etching, doping, and deposition of metals. Throughout all of these steps, the semiconductive nature of the silicon and its surface must be maintained and/or specifically controlled. Contamination can alter the semiconductive nature of the silicon or disturb the intended circuit design, thereby reducing the yield of integrated circuits. Particles as small as 0.1 micrometer may, therefore, lead to failure of a semiconductor element. A particle can prevent the completion of a line or a particle can bridge across two lines. Contamination can be either direct on the silicon surface or it may be a contamination of a masking surface, changing the circuit design which is printed. Point-of-use filters must, therefore, remove particulates that would cause defects.

A filter used in the semiconductor fabrication process generally includes a membrane made of fibers. However, pores of the fiber membrane may have random shapes and sizes, and thus may pass some particles through the fiber membrane filter. In some case, a fiber membrane having the average pore size of 7 nm may pass particles of more than about 26 nm.

Embodiments of the disclosure are directed to a filter membrane having substantially uniform pore size and various method of manufacturing the filter membrane.

In some embodiments, as shown in FIG. 1A, the filter membrane 10 includes a base membrane 15 and a plurality of through holes 20 (pores) passing through the base membrane 15. FIG. 1A also shows a cross sectional view of the through hole 20. As illustrated in FIG. 1A, when viewed in a thickness direction from a top opening of the through hole, at least a part of the bottom opening can be seen. Thus, filter membranes according to embodiments of the disclosure have a different through path than the through path in a fiber based filter membrane. In some embodiments, the shape of the plurality of through holes 20 is substantially circular or oval. In other embodiments, the shape of the through holes is a square, a rectangle (e.g., slit) or a polygon (e.g., hexagon).

In some embodiments, the diameter of the plurality of circular through holes 20 is in a range from about 5 nm to about 50 nm, and in a range from about 10 nm to about 20 nm in other embodiments. When the shape is the through holes 20 is not circular, the average of the largest diameter and the smallest diameter can be considered as the diameter. Variation of the diameters (e.g., three sigma ($3\sigma$) value) of the through holes 20 is in a range from about 5% to about 25% of the average diameter in some embodiments, and is in a range from about 10% to about 20% in other embodiments. In some embodiments, the variation (uniformity) of the diameters can be calculated based on 10-50 hole measurements within the filter membrane 10. The diameter of the through holes 20 is set based on a size of particles to be removed and/or a flow conductance of the filter membrane. If the size of the through holes 20 is too large, it may not be possible to remove the particles effectively, and if the size of the through holes 20 is too small, the solution or liquid to be filtered may not smoothly flow through the filter membrane 10.

In some embodiments, the total number of the through holes 20 per unit area (e.g., per square micron) is in a range from about 100 to about 600 and is in a range from about 200 to about 400 in other embodiments. If the number of the through holes per unit area is too small, the solution or liquid to be filtered may not smoothly flow through the filter membrane 10. If the total number of through holes per unit area is too large, the strength of the filter membrane 10 decreases and the filter membrane may be easily broken.

Figure 1D:
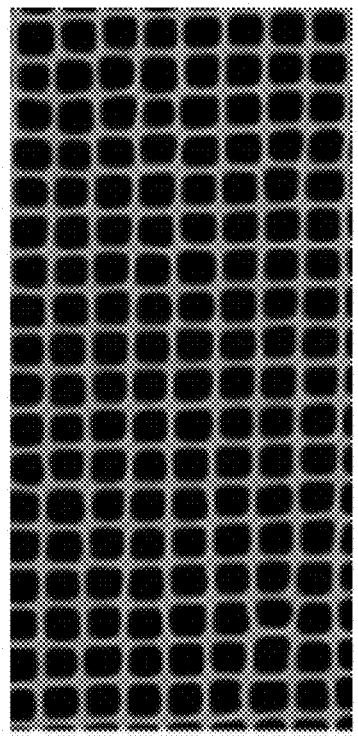

In some embodiments, the plurality of through holes 20 are arranged in a matrix. In some embodiments, the matrix of the through holes is a grid pattern as shown in FIG. 1B. In other embodiments, the matrix of the through holes is a staggered pattern as shown in FIG. 1C, where each through hole 20 is immediately adjacent to six other through holes 20. In some embodiments, when the through holes 20 have a square or a rectangular shape, the filter membrane 10 has a mesh structure as shown in FIG. 1D. In some embodiments, when the through holes 20 have a hexagonal shape, the filter membrane 10 has a honeycomb shape as shown in FIG. 1E. In other embodiments, the through holes 20 are arranged in a concentric circular arrangement. In some embodiments, the pitch of the through holes 20 is in a range from about 40 nm to about 100 nm, and is in a range from about 50 nm to about 70 nm in other embodiments. If the pitch is too large, the total number of the through holes 20 per unit area is too small, the solution or liquid to be filtered may not smoothly flow through the filter membrane 10. If the pitch of too small, the strength of the filter membrane 10 decreases and the filter 10 membrane may be broken easily.

In some embodiments, the thickness of the base membrane 15 is in a range from about 50 nm to about 500 nm, and is in a range from about 100 nm to about 200 nm. If the thickness is too large, it becomes more difficult to make the through holes 20 increases, and it the thickness is too small, the strength of the filter membrane 10 decreases and the filter membrane 10 may be easily broken. In some embodiments, the thickness of the base membrane 15 is greater when the size of the holes 20 is larger. In some embodiments, an aspect ratio (the thickness of the membrane 15 (depth of the hole 20) to the diameter of the hole 20) is in a range from about 1 to about 100 in some embodiments and is in a range from about 2 to about 10 in other embodiments.

In some embodiments, the shape or the area of the filter membrane 10 is a square, a rectangle, a polygon, or a circle.

In some embodiments, the material of the base membrane 15 is an organic polymer, such as a fluorocarbon polymer. In some embodiments, the organic polymer is a thermoplastic resin. In some embodiments, the organic polymer includes one or more of PTFE (polytetrafluoroethylene), PVDF (polyvinylidene fluoride), PFA (polyfluoroalkoxy), HDPE (high density polyethylene), PAS (polyarylsulfone), PES (polyether sulfone), PS (polysulfone), PP (polyproplyene) and PEEK (polyetheretherketone), or derivatives thereof.

In some embodiments, a filter membrane is coated with a coating material 18 as shown in FIG. 1A. In some embodiments, the coating material 18 is the same as or different from the base membrane 14, and includes a polymer, such as PTFE or any other fluorocarbon polymer. In some embodiments, the coating material 18 is used to avoid impurities from being released to the filtering liquid. In some embodiments, the coating material is formed by a deposition method, such as chemical vapor deposition (CVD), physical vapor deposition (PVD) including a sputtering, or any other suitable deposition method. In other embodiments, the coating material is formed by a spin-coating method. In some embodiments, the thickness of the coating material on the main surface of the base membrane 15 is in a range from about 100 nm to about 1000 nm. In some embodiments, the coating material reduces the diameter of the holes 20 by about 10 nm to about 200 nm.

FIGS. 2A-2G show various processes for fabrication the filter membrane according to embodiments of the present disclosure.

Figure 2A:
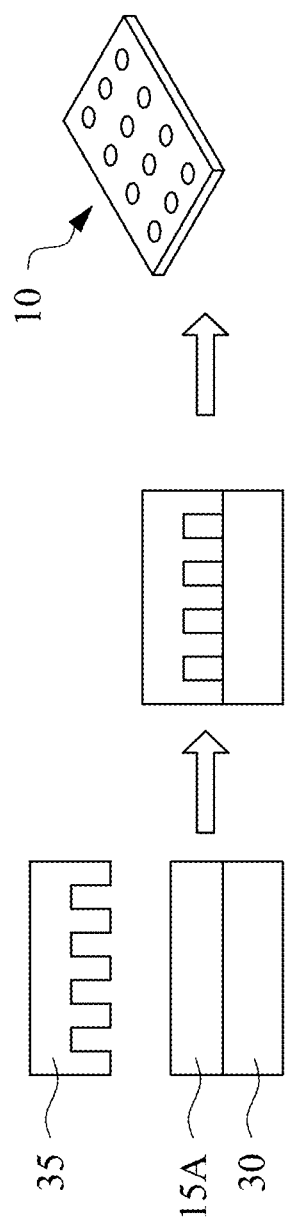
FIG. 2A schematically illustrates a sequential manufacturing process of a filter membrane according to an embodiment of the disclosure.

In the process shown in FIG. 2A, a nano-imprint lithography process is employed to fabricate the filter membrane 10. In some embodiments, a nano imprinting resist layer 15A is formed over a substrate 30. In some embodiments, the substrate 30 is a silicon wafer (e.g., a 120 mm, 150 mm, 200 mm or 300 mm wafer), a glass substrate, a ceramic substrate, or a resin substrate. In some embodiments, the nano imprinting resist layer 15A includes a polymer material or a precursor of the polymer material. In some embodiments, the nano imprinting resist layer 15A is formed over the substrate 30 by a spin-coating method. In some embodiment, a photo resist material including polymethyl methacrylate (PMMA) (about 2-5%) in an anisole solution is supplied to the rotating substrate 30. In some embodiments, the coating is performed at the rotating speed about 3000 to 5000 rpm for about 20-60 seconds. After the coating, the substrate 30 is baked at 140-180° C. for about 40-80 minutes. In other embodiments, the nano imprinting resist layer 15A is formed by a deposition method, such as chemical vapor deposition (CVD), physical vapor deposition (PVD) including a sputtering, or any other suitable deposition method. In some embodiments, the coating material is formed by spin-coating a melted material at a temperature of about 50% to 70% of the boiling point of the polymer layer 15A.

Then, a mold 35 is pressed into the nano imprinting resist layer 15A such that the mold 35 is in contact with the substrate 30. In some embodiments, the mold 35 includes a plurality of protrusions corresponding to the plurality of holes 20. After the mold 35 is pressed to the nano imprinting resist layer 15A, the mold and the substrate 30 is heated. In some embodiments, the material for the layer 15A is a thermosetting resin. In some embodiments, the mold 35 and/or the substrate 30 is heated above the glass transition temperature or the melting point of the material for the nano imprinting resist layer 15A, and then the mold 35 is pressed to the nano imprinting resist layer 15A.

Then, the substrate 30 and the mold 35 is cooled down to the room temperature (e.g., 25° C.), and the filter membrane 10 is removed from the substrate 30. In some embodiments, one or more underlying layers are formed between the nano imprinting resist layer 15A and the substrate 30, and the filter membrane 10 is removed from the substrate 30 by removing the underlying layer (a lift-off process). In some embodiments, printing by the mold 35 is repeated to form a large area filter membrane. In some embodiments, after the filter membrane 10 is formed, a coating material as set forth above is formed. In some embodiments, the coating material is formed at a temperature of about 50% to 70% of the boiling point of the coating material.

Figure 2B:
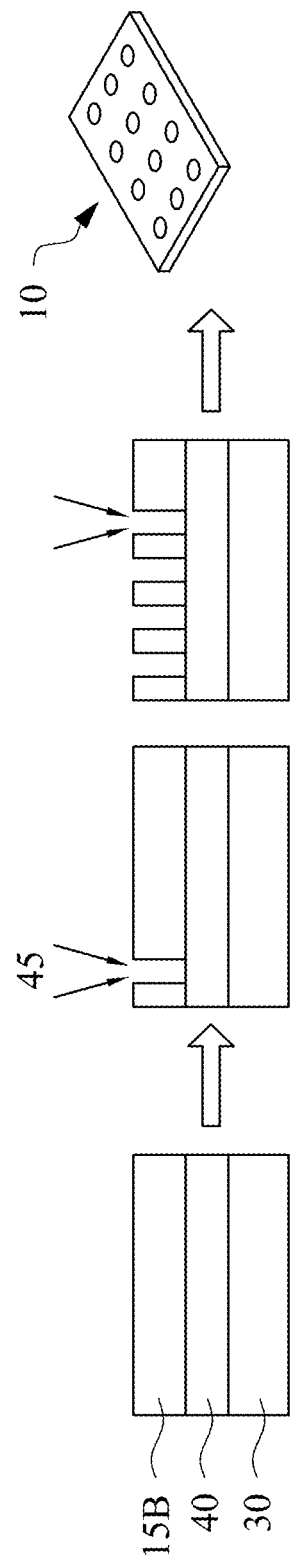
FIG. 2B schematically illustrates a sequential manufacturing process of a filter membrane according to an embodiment of the disclosure.

In the process shown in FIG. 2B, a laser patterning process is employed to fabricate the filter membrane 10. In some embodiments, the laser patterning process is a laser ablation process. In some embodiments, a photo resist layer 40 is formed over a substrate 30 for the subsequent lift-off process. In other embodiments, a polymer layer that can dissolve into a solvent selective to the membrane material is used. Then, a polymer layer 15B for the filter membrane is formed over the photo resist layer 40. The material of the polymer layer 15B is one or more polymers as set forth above, and is formed by a spin-coating method or a deposition method, such as CVD, PVD including a sputtering, or any other suitable deposition method. In some embodiments, the coating material is formed by a spin-coating by a melted material at a temperature of about 50% to 70% of the boiling point of the polymer layer 15B.

Then, a laser beam 45 is applied to the polymer layer 15B to directly pattern the polymer layer 15B. In some embodiments, the laser beam 45 is a focused laser beam, such as a excimer layer (KrF or ArF laser), gas laser ($CO_2$ laser), solid laser source (YAG laser), and any suitable laser. In the laser ablation process, a part of the polymer layer is removed from the polymer layer 15B, by evaporation or sublimation.

In some embodiments, the laser patterning process is a laser interference patterning process. In some embodiments, two or more laser beams are applied to form an interference pattern on the polymer layer 15B. The interference pattern has a smaller dimension than a focused laser beam focused by an optical lens. The laser sources can be the same as set forth above. A part of the polymer layer is removed from the polymer layer 15B, by evaporation or sublimation.

After the patterning, the photo resist layer 40 is removed from the substrate 30 by a lift-off process, to obtain the filter membrane 10. In some embodiments, no photo resist layer is formed and the polymer layer 15B is directly formed on the substrate 30.

Figure 2C:
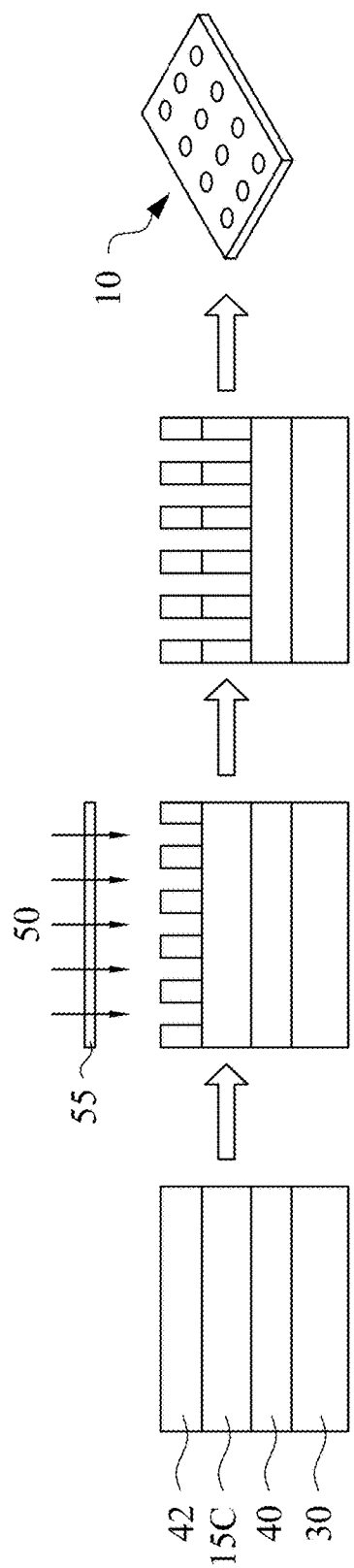
FIG. 2C schematically illustrates a sequential manufacturing process of a filter membrane according to an embodiment of the disclosure.

In the process shown in FIG. 2C, a photo lithography process is employed to fabricate the filter membrane 10. In some embodiments, a first photo resist layer 40 is formed over a substrate 30 for subsequent lift-off process. In other embodiments, a polymer layer that can dissolve into a solvent selective to the membrane material is used. Then, a polymer layer 15C for the filter membrane is formed over the first photo resist layer 40. The material of the polymer layer 15C is one or more polymers as set forth above, and is formed by a spin-coating method or a deposition method, such as CVD, PVD including sputtering, or any other suitable deposition method. Further, a second photo resist layer 42 is formed over the polymer layer 15C.

Then, an exposure light 50 is applied through a photo mask 55 to the second photo resist layer 42 in some embodiments. The photo mask 55 includes patterns corresponding to the plurality of holes 20. In some embodiments, the exposure light 50 is ultra violet (UV) light, deep UV (DUV) light, or extreme UV (EUV) light. In some embodiments, an electron beam is used as the exposure light. In some embodiments, the exposure is repeated by a step-and-exposure manner. Then, the exposed second photo resist layer 42 is developed to form a plurality of hole patterns. In some embodiments, a direct writing by an electron beam (no photo mask) is employed to form the plurality of hole patterns in the second photo resist layer 42.

Next, an etching operation is performed to convert the plurality of hole patterns into the polymer layer 15C. In some embodiments, the etching operation is dry etching. In some embodiments, the dry etching is plasma dry etching using CO and $H_2$ gases. In some embodiments, the flow rate of CO gas is in a range from about 15 sccm to about 50 sccm and the flow rate of $H_2$ gas is in a range from about 40 sccm to 60 sccm.

After the etching operation, the second photo resist layer 42 and the first photo resist layer 40 are removed from the substrate 30, to obtain the filter membrane 10. In some embodiments, no first photo resist layer is formed and the polymer layer 15C is directly formed on the substrate 30.

Figure 2D:
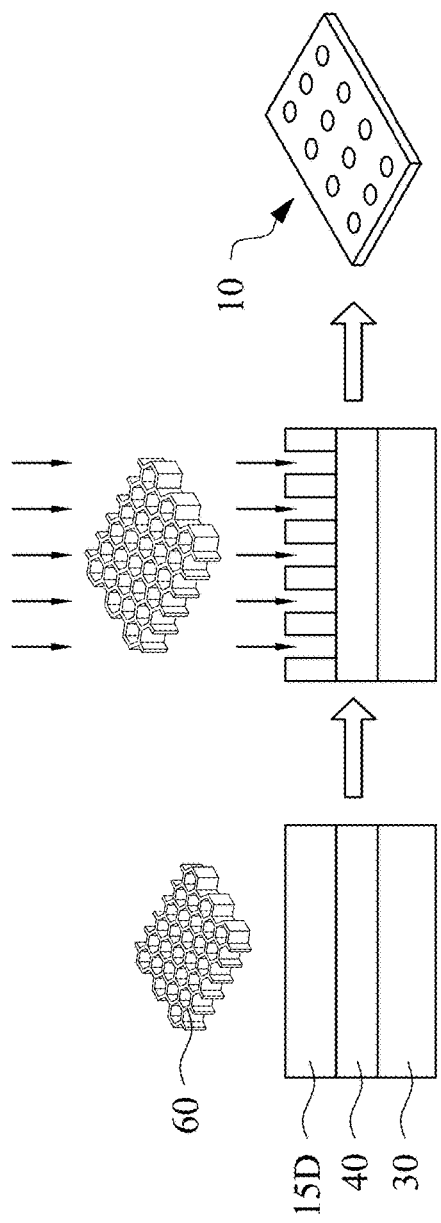
FIG. 2D schematically illustrates a sequential manufacturing process of a filter membrane according to an embodiment of the disclosure.

In the process shown in FIG. 2D, a polymer layer for the base membrane is directly etched through a hard mask. In some embodiments, a photo resist layer 40 is formed over a substrate 30. In other embodiments, a polymer layer that can dissolve into a solvent selective to the membrane material is used. Then, a polymer layer 15D for the filter membrane is formed over the photo resist layer 40. The material of the polymer layer 15D is one or more polymers as set forth above, and is formed by a spin-coating method or a deposition method, such as CVD, PVD including sputtering, or any other suitable deposition method.

Then, a hard mask 60 having a plurality of holes corresponding to the plurality of through holes 20 is placed on or over the polymer layer 15D. In some embodiments, the hard mask 60 is in contact with the polymer layer 15D, and in other embodiments, the hard mask 60 is proximity to the polymer layer 15D by about 1 μm to about 1 mm. In some embodiments, the hard mask 60 is made of a ceramic material. According to some embodiments, the ceramic material includes, for example, but not limited to, boron nitride (BN), alumina ($Al_2O_3$, e.g., anodic aluminum oxide), silicon nitride ($Si_3N_4$), silicon carbide (SiC), zirconia ($ZrO_2$), $SiO_2$, barium titanate ($BaTiO_3$), $Y_2O_3$, $PbTiO_3$, $PbZrO_3$, $Y_3Al_5O_{12}$, YAS ($Y_2O_3$—$Al_2O_3$—$SiO_2$), $YF_3$, and $Y_2O_3$—$ZrO_2$—$Al_2O_3$. In some embodiments, the hard mask 60 is made of a bulk ceramic material, or a ceramic coated on metal, or other material. The ceramic material may be a sintered body. In other embodiments, glass or metallic material coated with a ceramic material is used for the hard mask 60. In some embodiments, the surface of the hard mask 60 is coated with a coating material such as a silicon oxide, silicon nitride or any other material. The hard mask 60 is reusable and is different from a hard mask layer formed by a deposition process.

Next, the polymer layer 15D is etched by a plasma through the holes in the hard mask 60. The plasm dry etching employs one or more gases including $C_4F_8$, $SF_6$, $O_2$ or Ar in some embodiments. In some embodiments, the input power of the plasma is about 500-800 W. The etching is repeated step-by-step basis for about 20-40 times. In some embodiments, the photo resist layer 40 is also at least partially etched.

After the etching operation, the photo resist layer 40 is removed from the substrate 30, to obtain the filter membrane 10. In some embodiments, no first photo resist layer is formed and the polymer layer 15D is directly formed on the substrate 30.

Figure 2E:
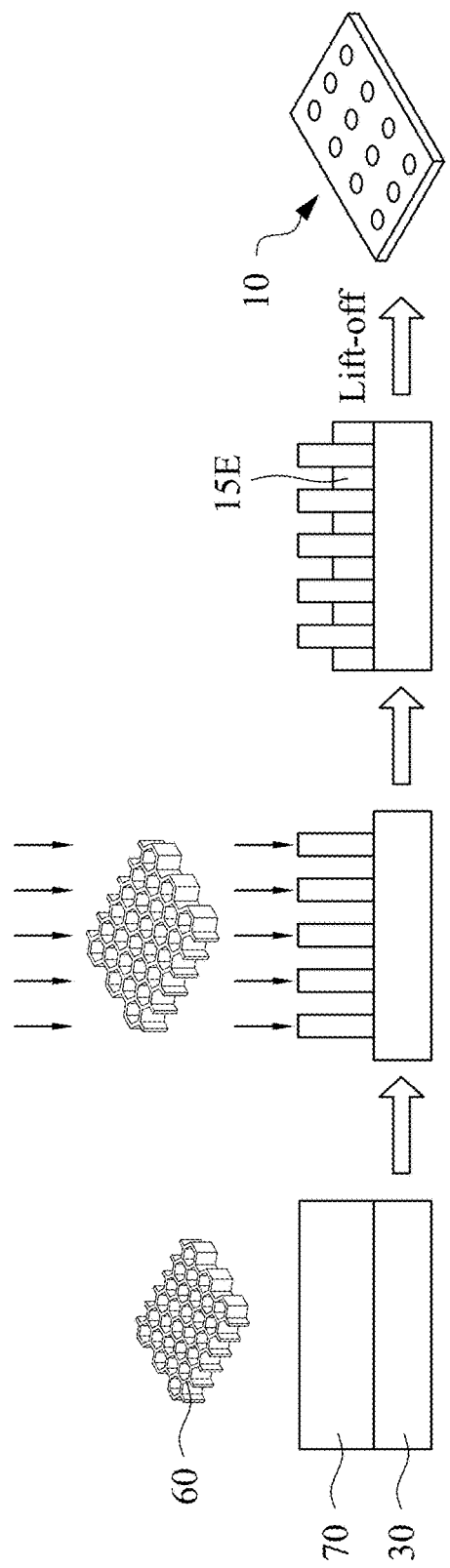
FIG. 2E schematically illustrates a sequential manufacturing process of a filter membrane according to an embodiment of the disclosure.

In the process shown in FIG. 2E, a sacrificial polymer layer is patterned to form a plurality of pillars, and then a polymer layer for the filter membrane is formed over the substrate. In some embodiments, a sacrificial layer 70 is formed over a substrate 30. In some embodiments, the sacrificial layer 70 is a polymer layer different from the polymer layer for the filter membrane. In some embodiments the sacrificial layer 70 is a photo resist layer.

Then, a hard mask 60 having a plurality of holes corresponding to the plurality of through holes 20 is placed on or over the sacrificial layer 70. In some embodiments, the hard mask 60 is in contact with the sacrificial layer 70, and in other embodiments, the hard mask 60 is proximity to the sacrificial layer 70 by about 1 μm to about 1 mm. Next, the sacrificial layer 70 is etched by plasma through the holes in the hard mask 60. The plasm dry etching employs one or more gases including $C_4F_8$, $SF_6$, $O_2$ or Ar in some embodiments. In some embodiments, the input power of the plasma is about 500-800 W. The etching is repeated step-by-step basis for about 20-40 times.

Then, a polymer layer 15E for the filter membrane is deposited over the substrate 30. The material of the polymer layer 15E is one or more polymers as set forth above, and is formed by a spin-coating method or a deposition method, such as CVD, PVD including sputtering, or any other suitable deposition method. In some embodiments, the thickness of the deposited polymer layer 15E is smaller than the thickness of the sacrificial layer 70. Since the sacrificial layer 70 forms a plurality of pillars spaced apart from each other, the deposited polymer layer 15E forms a sheet with a plurality of holes into which the pillars are disposed. In some embodiments, a thermal process is performed to improve the quality of the filter membrane.

After the deposition operation, the sacrificial layer 70 is removed, and the filter membrane 10 is also removed from the substrate 30. In some embodiments, one or more underlying layers are formed between the sacrificial layer 70 and the substrate 30, and the filter membrane 10 is removed from the substrate 30 by removing the underlying layer (a lift-off process).

Figure 2F:
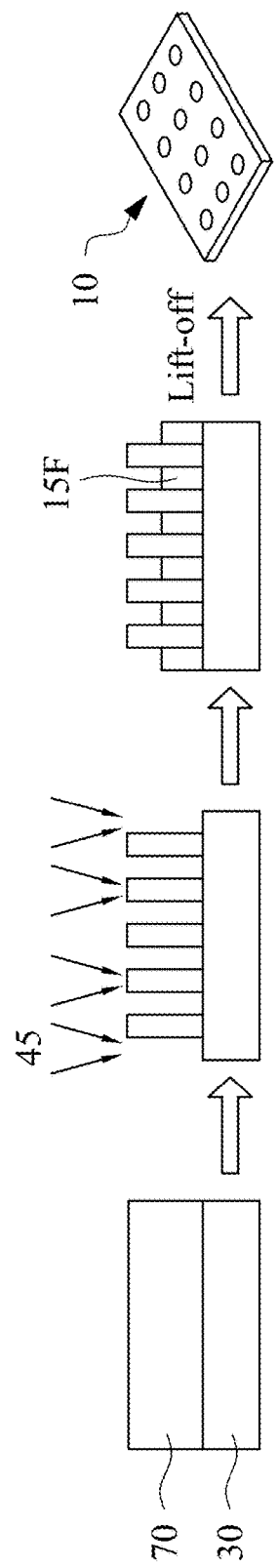
FIG. 2F schematically illustrates a sequential manufacturing process of a filter membrane according to an embodiment of the disclosure.

In the process shown in FIG. 2F, a sacrificial polymer layer is patterned to form a plurality of pillars by using a laser patterning process similar to that explained with respect to FIG. 2B. In some embodiments, a sacrificial layer 70 is formed over a substrate 30. In some embodiments, the sacrificial layer 70 is a polymer layer different from the polymer layer for the filter membrane. In some embodiments the sacrificial layer 70 is a photo resist layer.

Then, the sacrificial layer 70 is etched by the direct laser patterning using a focused laser beam or an interference laser beam, as explained above with respect to FIG. 2B. Unlike the laser process shown in FIG. 2B, in which holes are formed, the laser patterning forms a plurality of pillars.

Then, a polymer layer 15F for the filter membrane is deposited over the substrate 30. The material of the polymer layer 15F is one or more polymers as set forth above, and is formed by a spin-coating method or a deposition method, such as CVD, PVD including sputtering, or any other suitable deposition method. In some embodiments, the thickness of the deposited polymer layer 15F is smaller than the thickness of the sacrificial layer 70. Since the sacrificial layer 70 forms a plurality of pillars spaced apart from each other, the deposited polymer layer 15F forms a sheet with a plurality of holes into which the pillars are disposed. In some embodiments, a thermal process is performed to improve the quality of the filter membrane.

After the deposition operation, the sacrificial layer 70 is removed, and the filter membrane 10 is also removed from the substrate 30. In some embodiments, one or more underlying layers are formed between the sacrificial layer 70 and the substrate 30, and the filter membrane 10 is removed from the substrate 30 by removing the underlying layer (a lift-off process).

In the process shown in FIG. 2G, a sacrificial polymer layer is patterned to form a plurality of pillars by using a lithography process similar to that explained with respect to FIG. 2C. In some embodiments, a sacrificial layer 72 is formed over a substrate 30. In some embodiments the sacrificial layer 72 is a photo resist layer.

Then, the photo resist layer 72 is patterned by a lithography process, as explained above with respect to FIG. 2C. Unlike the laser process shown in FIG. 2C, in which holes are formed, the lithography process results in a plurality of pillars.

Then, a polymer layer 15G for the filter membrane is deposited over the substrate 30. The material of the polymer layer 15G is one or more polymers as set forth above, and is formed by a spin-coating method or a deposition method, such as CVD, PVD including sputtering, or any other suitable deposition method. In some embodiments, the thickness of the deposited polymer layer 15G is smaller than the thickness of the photo resist layer 72. Since the photo resist layer 72 forms a plurality of pillars spaced apart from each other, the deposited polymer layer 15G forms a sheet with a plurality of holes into which the pillars are disposed. In some embodiments, a thermal process is performed to improve the quality of the filter membrane.

After the deposition operation, the photo resist layer 72 is removed, and the filter membrane 10 is also removed from the substrate 30. In some embodiments, one or more underlying layers are formed between the photo resist layer 72 and the substrate 30, and the filter membrane 10 is removed from the substrate 30 by removing the underlying layer (a lift-off process).

In the process shown in FIG. 2H, the plurality of pillars are formed by an inorganic material. In some embodiments, a sacrificial layer 75 is formed over a substrate 30. In some embodiments the sacrificial layer 75 is made of one or more layers of a dielectric material (e.g., silicon oxide, silicon nitride, aluminum oxide, etc.), a metal or metallic material (e.g., Al, Cu, Ni, Au, Ag, Ti, Ta, W, etc. or alloy thereof) or a semiconductor material (amorphous or polycrystalline Si, SiGe, Ge, etc.).

Then, by using one or more lithography and etching operations, the layer 75 is patterned to form a plurality of pillars.

Then, a polymer layer 15H for the filter membrane is deposited over the substrate 30. The material of the polymer layer 15H is one or more polymers as set forth above, and is formed by a spin-coating method or a deposition method, such as CVD, PVD including sputtering, or any other suitable deposition method. In some embodiments, the thickness of the deposited polymer layer 15H is smaller than the thickness of the pillars by the sacrificial layer 75. Since the sacrificial layer 75 forms a plurality of pillars spaced apart from each other, the deposited polymer layer 15H forms a sheet with a plurality of holes into which the pillars are disposed. In some embodiments, a thermal process is performed to improve the quality of the filter membrane.

After the deposition operation, the filter membrane 10 is removed from the substrate 30. In some embodiments, one or more underlying layers are formed between the photo resist layer 72 and the substrate 30, and the filter membrane 10 is removed from the substrate 30 by removing the underlying layer and the pillars 75. In other embodiments, only the filter membrane is removed, and the substrate 30 with the plurality of pillars can be reused to form another filter membrane.

In the embodiments of FIGS. 2E-2H, the shape of the plurality of pillars is a tapered (a top is smaller than the bottom), and thus the plurality of through holes 20 in the filter membrane also has a tapered shape.

Figure 3B:
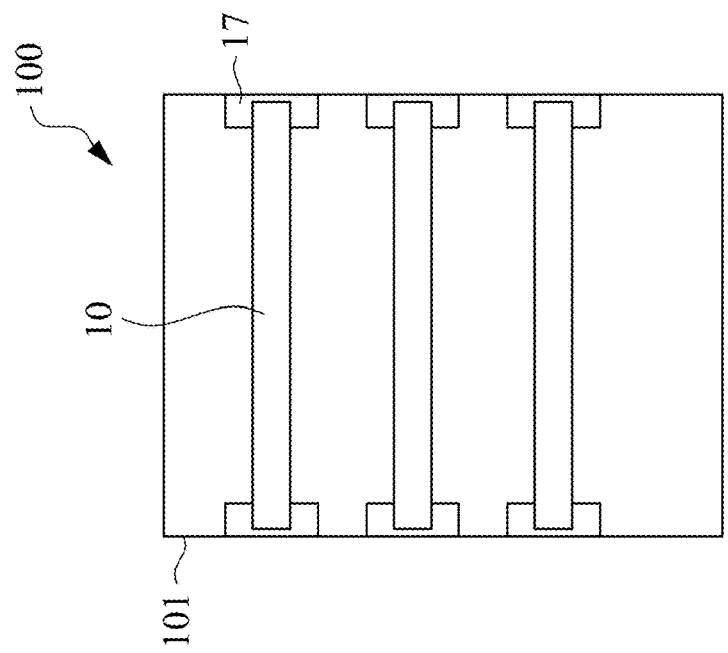
FIGS. 3A and 3B illustrate schematic views of a filter device according to embodiments of the present disclosure.
Figure 3A:
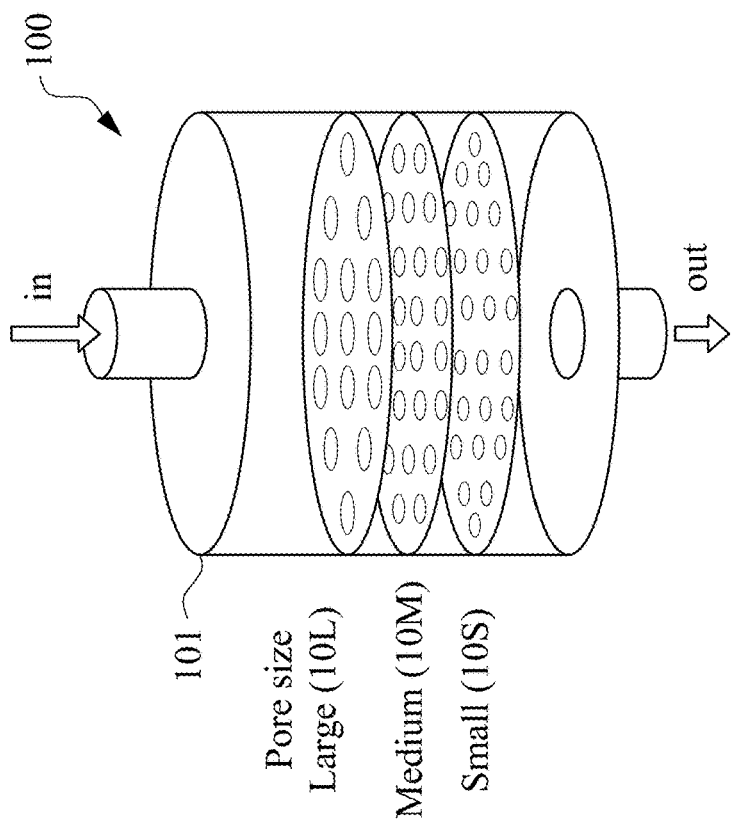

FIG. 3A shows a filter 100 according to an embodiment of the present disclosure. In some embodiments, one or more filter membranes fabricated by one or more processes as set forth above are disposed in a filter body (housing) 101 of the filter 100. In some embodiments, the housing 101 is a cylindrical and the filter membranes have a disk shape. In some embodiments, only one filter membrane is used, and in other embodiments, multiple filter membranes having the same or different average hole diameters. In some embodiments, the filter membranes have the same average diameters (designed diameter) and in other embodiments, the filter membranes have two or more different average diameters. In some embodiments, when the filter membranes have different average diameters, for example, a filter membrane 10L having a large size diameter, a filter membrane 10M having a medium size diameter and a filter membrane 10S having a small size diameter, the large size filter membrane 10L is placed upstream of the solution flow, and the small size filter membrane 10S is placed downstream of the solution flow, as shown in FIG. 3A. In some embodiments, the smallest hole (pore) size is smaller than a target size of particles to be removed. In some embodiments, the difference in size is about 10%-100%. In some embodiments, multiple filter membranes are stacked to be in contact with adjacent one of the filter membranes. In other embodiments, the multiple filter membranes are arranged spaced apart from each other. In some embodiments, multiple filter devices 100 each including one or more filter membrane having the same average diameter but having a different diameter from the other filter devices are connected in series. When the through holes 20 have a tapered shape, the side having a larger opening diameter is arranged at the upstream side of the solution flow in some embodiments. The flow direction is top to bottom in some embodiments, and the large hole size filter membrane 10L is located at an upstream side.

In some embodiments, as shown in FIG. 3B, the filter membrane 10 is attached the filter housing via a connection member 17. In some embodiments, the connection member 17 is configured to fluid tightly attach the filter membrane 10 to the filter housing 101 so that fluid must pass through the filter membrane 10, and not around the filter membrane 10. In some embodiments, the connection member 17 is made of a synthetic rubber or a fluorine-containing polymer.

In some embodiments, the filter device 100 is used in the vertical direction as shown in FIG. 3A (flow direction is vertical), and in other embodiments, the filter device 100 is used in the horizontal direction (flow direction is horizontal). The flow direction is up to down in some embodiments as shown in FIG. 3A, and in other embodiments, the flow direction is bottom to top. Depending on the flow directions, the order of filter membranes may be changed.

Figure 3E:
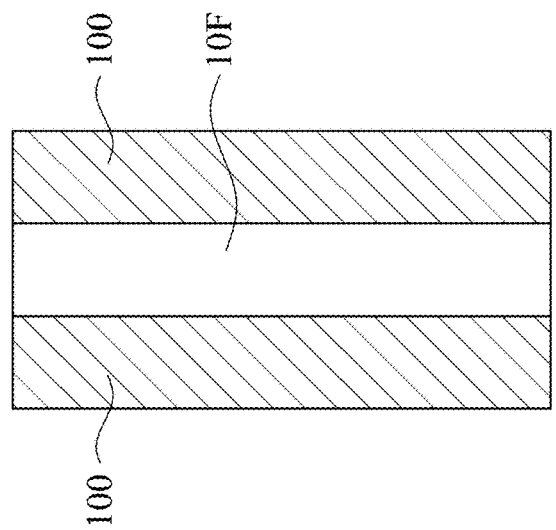
FIGS. 3C, 3D, 3E, 3F, and 3G show various filter structures according to embodiments of the present disclosure.
Figure 3D:
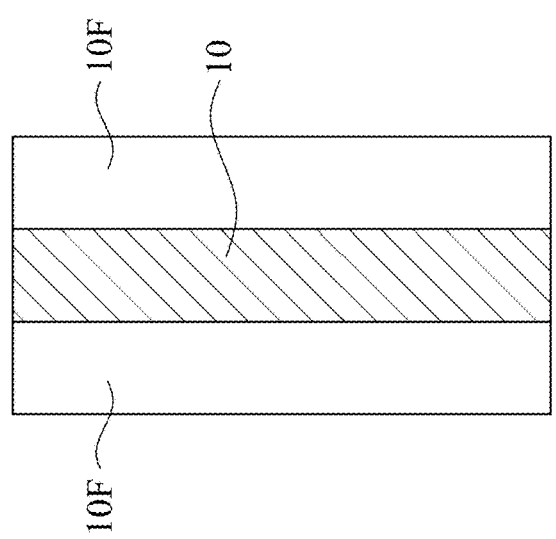
Figure 3C:
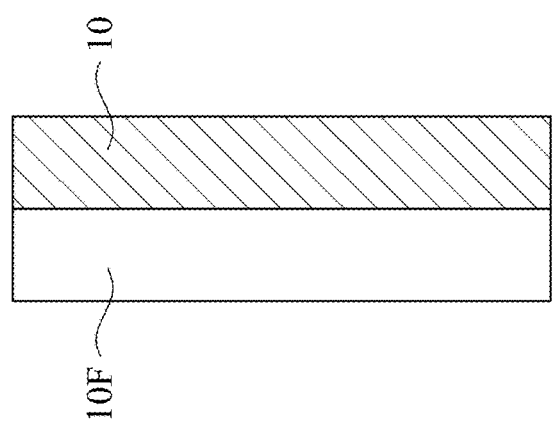
Figure 3G:
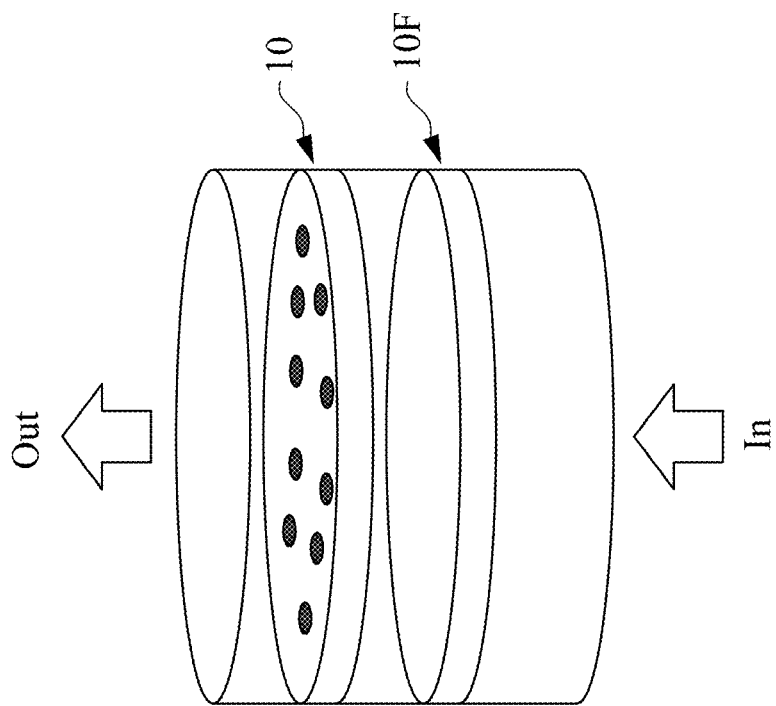
Figure 3F:
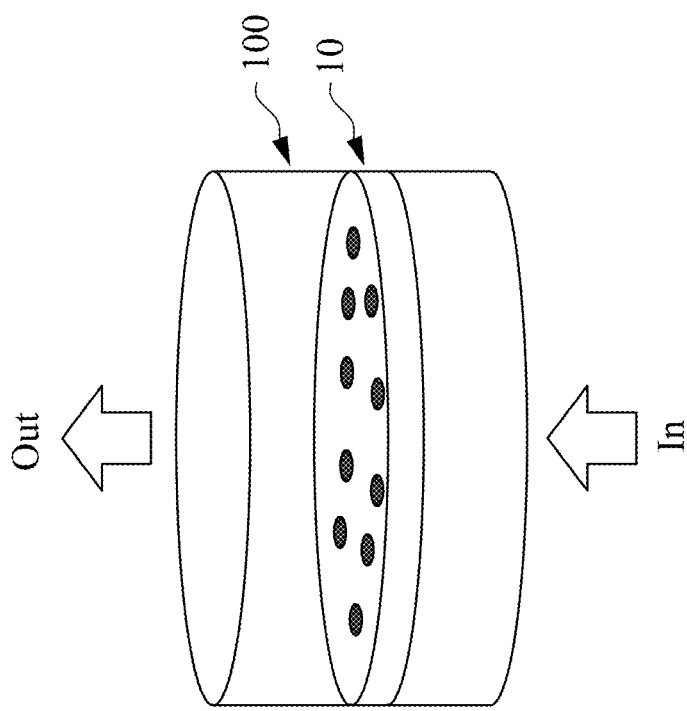

In some embodiments, the filter membrane 10 is used alone as shown in FIGS. 3A and 3F, or used with another type of filter membrane, as shown in FIGS. 3C, 3D, 3E and 3G. In some embodiments, the filter membrane 10 according to the present embodiments is used with a fiber based filter membrane 10F having random hole sizes. In other embodiments, a ceramic based filter membrane having random hole sizes is used with the filter membrane 10. In some embodiments, the fiber based filter membrane 10F is attached to the front and/or rear surface of the filter membrane 10, as shown in FIGS. 3C and 3D. In other embodiments, the filter membranes 10 are attached to the front and rear surface of the fiber based filter membrane 10F, as shown in FIG. 3E. In some embodiments, the filter membrane 10 is attached to part of the fiber-based filter membrane 10F.

FIG. 3F is a filter device 100 according to one embodiment of the present disclosure. In this embodiment, one filter membrane 10 is used and the flow direction is bottom to top. FIG. 3G is a filter device 100 according to one embodiment of the present disclosure. In this embodiments, one or more fiber based filter membranes 10F and one or more filter membranes 10 are used. The flow direction is bottom to top in some embodiments, and the fiber based filter membrane 10F is located at an upstream side.

Figure 4B:
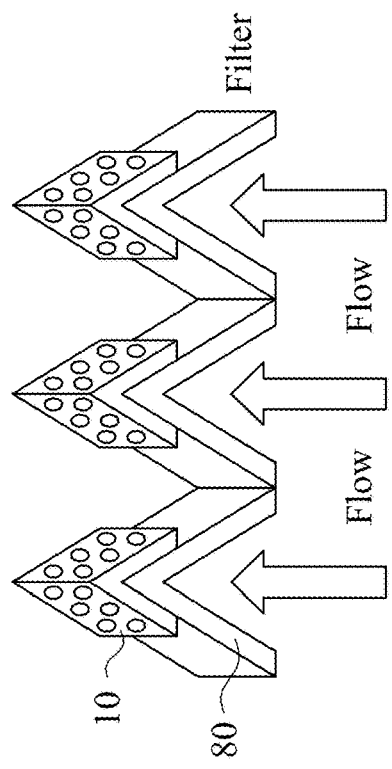
FIGS. 4A and 4B show schematic views of filter membranes according to embodiments of the present disclosure.
Figure 4A:
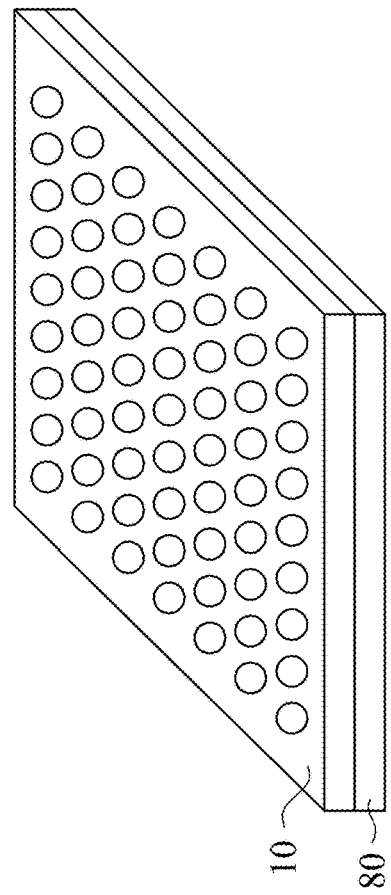

In some embodiments, the filter membrane 10 according to the present embodiments is used with a fiber-based filter membrane 80, as shown in FIGS. 4A and 4B. In some embodiments, the fiber-based filter membrane 80 is attached to the front and/or rear surface of the filter membrane 10.

In some embodiments, the filter membrane 10 is attached to part of the fiber-based filter membrane 80. In some embodiments, the fiber-based filter membrane 80 is folded, and in such a case, particles may pass through a concave portion (seen from the flow direction) of the folded membrane, due to, for example, pressure concentration. In some embodiments, as shown in FIG. 4B, a piece of the filter membrane 10 is attached to the concave portion such that the solution flows through the fiber-based membrane 80 and then through the filter membrane 10. In some embodiments, the piece of the filter membrane 10 is attached to the opposite side such that the solution flows through the filter membrane 10 and then through the fiber-based membrane 80.

Figure 5A:
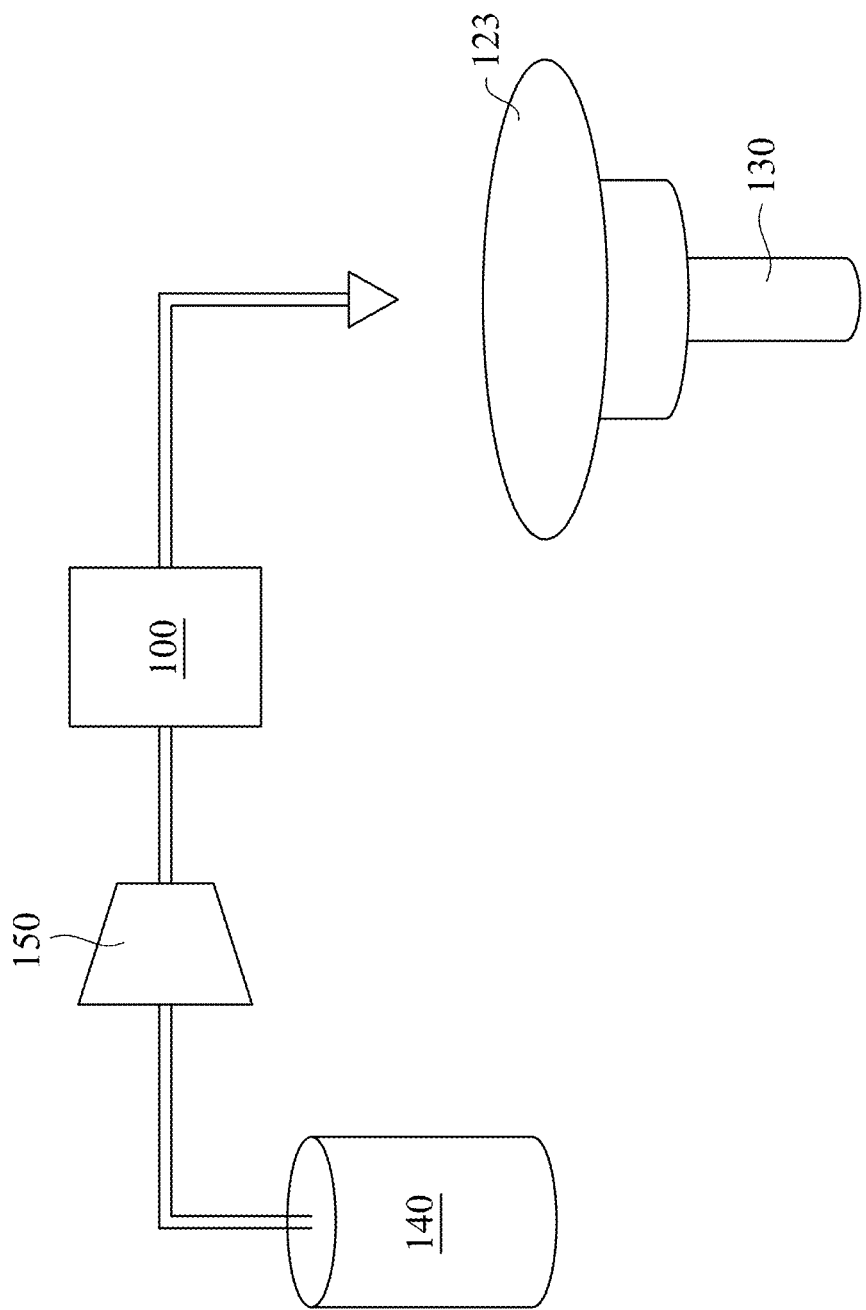
FIGS. 5A and 5B show schematic views of an apparatus using the filter device of the present disclosure.
Figure 5B:
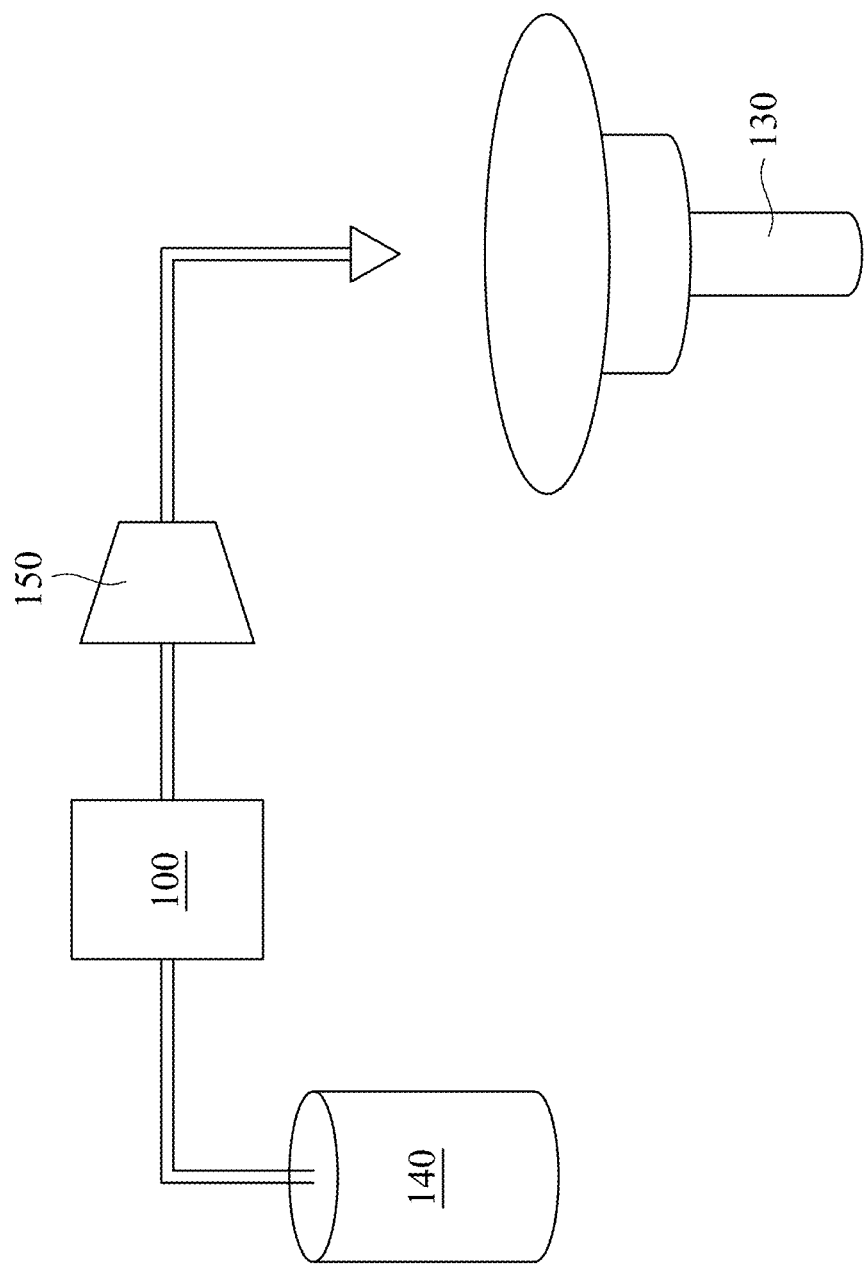
Figure 6:
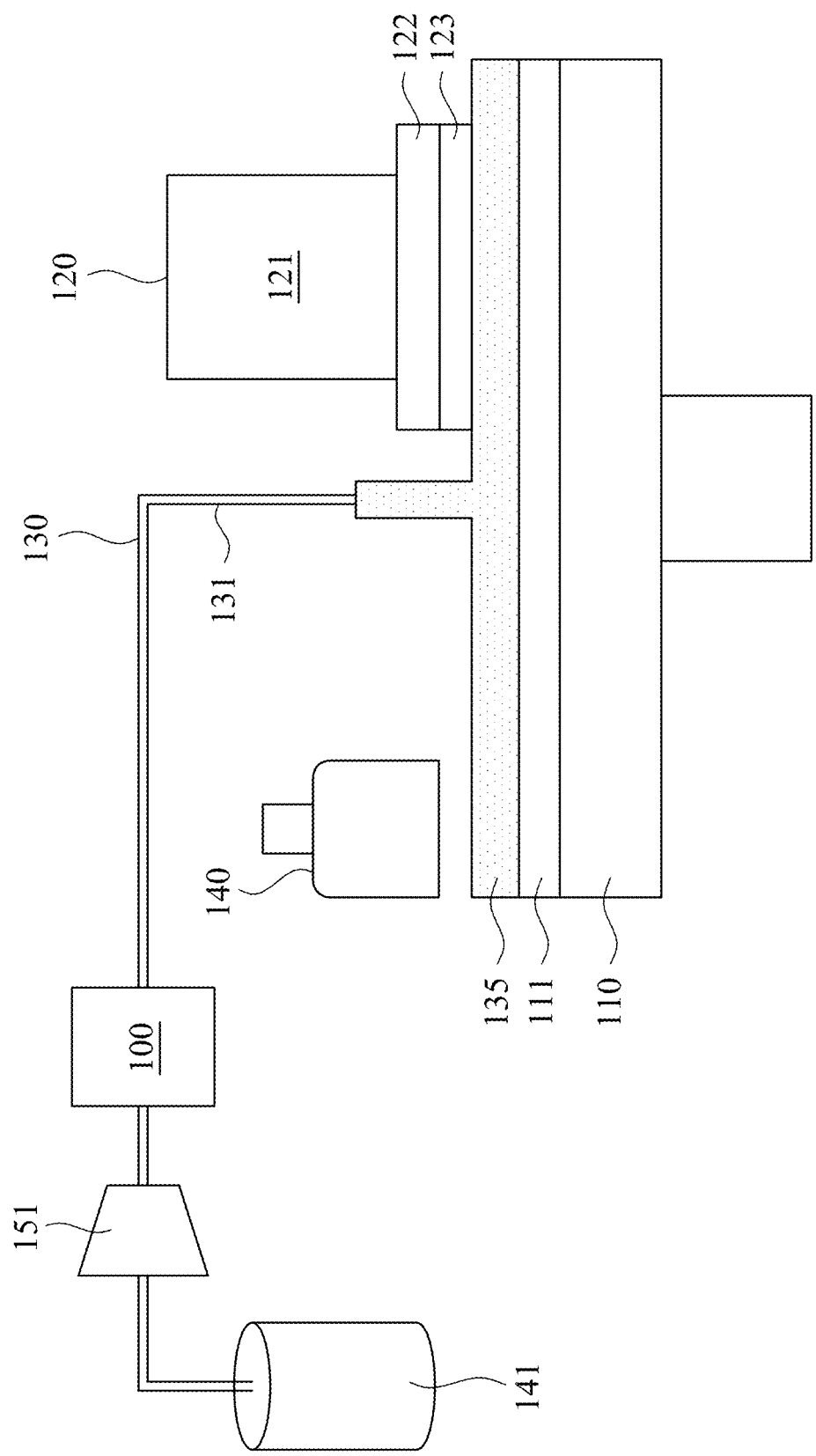
FIG. 6 shows a schematic view of an apparatus using the filter device of the present disclosure.

FIGS. 5A, 5B and 6 show applications of the filter device 100 using the filter membrane 10 according to embodiments of the present disclosure.

FIGS. 5A and 5B show a liquid or solution supplying system for manufacturing a semiconductor device. In some embodiments, a liquid or solution supplying system is a photo resist coating apparatus, including a photo resist container (e.g., tank or bin) 140, a pump 150 and the filter device 100. In some embodiments, the filter device 100 is disposed downstream of the pump 150 as shown in FIG. 5A, and in other embodiments, the filter device 100 is disposed upstream of the pump 150 as shown in FIG. 5B. As shown in FIGS. 5A and 5B, the photo resist passing through the filter device is supplied on a wafer 123 that is rotated by a wafer rotation mechanism 130. Particles that may exist in the photo resist can be filtered by the filter membrane 10 contained in the filter device 100, and the filtered photo resist is supplied to the wafer 123. In other embodiments, a liquid or solution supplying system is a photo resist developing apparatus, including a developer container (e.g., tank or bin) 140, a pump 150 and the filter device 100. Particles that may exist in the developer can be filtered by the filter membrane 10 contained in the filter device 100 and the filtered developer is supplied to the wafer 123. In other embodiments, a liquid or solution supplying system is a wafer cleaning or etching apparatus, including a solution container (e.g., tank or bin) 140 for storing a cleaning or etching solution, a pump 150 and the filter device 100. Particles that may exist in the cleaning or wet etching solution can be filtered by the filter membrane 10 contained in the filter device 100 and the filtered developer is supplied to the wafer 123. In some embodiments, the cleaning solution is an aqueous solution of ammonium hydroxide and hydrogen peroxide, an aqueous solution of hydrochloric acid and hydrogen peroxide, an organic solvent (e.g., IPA), or any other cleaning solution used in the fabrication of a semiconductor device. In some embodiments, the wet etching solution includes HF, phosphoric acid or any other wet etchant used in the fabrication of a semiconductor device.

In some embodiments, a liquid or solution supplying system is a slurry supplying system for a chemical mechanical polishing (CMP) apparatus as shown in FIG. 6. In some embodiments, the CMP apparatus includes a rotatable platen 110, a polishing head assembly 120, a chemical slurry supply system 130, and a pad conditioner 140. In some embodiments, the platen 110 is connected to a motor (not shown) which rotates the platen 110 at a preselected rotational velocity. In some embodiments, the platen 110 is covered with a replaceable polishing pad 111 of a relatively soft material. In some embodiments, the pad 111 is a thin polymeric disc with a grooved surface, and can be porous or solid, depending on the application. Factors determining the material and physical properties of the pad 111 include the material to be polished (i.e., material at the wafer surface), and the desired roughness after polishing. The pad 111 may have a pressure sensitive adhesive on the back so that the pad 111 adheres to the platen 110. During the polishing process, the pad may be wetted with a suitable lubricant material, depending on the type of material being polished (i.e., the material at the top surface of the wafer). In an embodiment, the polishing head assembly 120 includes a head 121 and a carrier 122. The head 121 holds the carrier 122 which in turn holds a wafer 123 to be polished. In some embodiments, the head 121 may include a motor for rotating the wafer 123 relative to the platen 110. In some embodiments, the wafer 123 and the platen 110 are rotated in an asynchronous non-concentric pattern to provide a non-uniform relative motion between the platen 110 and the wafer 123. The assembly 120 applies a controlled downward pressure to the wafer 123 to hold the wafer 123 against the platen 110.

The slurry supply system 130 introduces a chemical slurry 135 of a suitable material to be used as an abrasive medium between the pad 111 and the wafer 123. In an embodiment, the slurry 135 is a colloid of abrasive particles dispersed in water with other chemicals such as rust inhibitors and bases to provide an alkaline pH. In some embodiments, the abrasive particles are made of materials such as, for example, silica, ceria, and alumina. In an embodiment, the abrasive particles have a generally uniform shape and a narrow size distribution, with an average particle size ranging from about 10 nm to about 100 nm or more depending on the application for which it is being used.

In an embodiment, the slurry supply system 130 includes a slurry storage 141 (e.g., tank), a pump 151 and a filter device 100 connected by a conduit 131 for delivering the slurry 135 to the polishing pad 111 atop the platen 110. In some embodiments, the filter device 100 is disposed downstream of the pump 151, and in other embodiments, the filter device 100 is disposed upstream of the pump 151. Particles that may exist in the slurry 135 can be filtered by the filter membrane 10 contained in the filter device 100 and the filtered slurry is supplied to the pad 111.

In the present embodiments, since uniform through holes are formed in a base membrane in a filter membrane, it is possible to improve the particle capturing rate. Because the filter membrane is fabricated by a fine patterning operation, the uniformity of the hole size (pore size) can be improved. Further, because it is easier to control the hole size, various filter membrane having different pore sizes can be effectively and easily used in a filter device.

According to one aspect of the present disclosure, a filter device includes one or more filter membranes, and a filter housing enclosing the one or more filter membranes. Each of the filter membranes includes a base membrane and a plurality of through holes. In one or more of the foregoing and following embodiments, an average diameter of the plurality of through holes is in a range from 5 nm to 50 nm. In one or more of the foregoing and following embodiments, a variation of diameters of the plurality of through holes is in a range from 5% to 25% of the average diameter. In one or more of the foregoing and following embodiments, a thickness of the base membrane is in a range from 50 nm to 500 nm. In one or more of the foregoing and following embodiments, an aspect ratio of plurality of through holes is in a range from 2 to 10. In one or more of the foregoing and following embodiments, the base membrane includes one or more of PTFE (polytetrafluoroethylene), PVDF (polyvinylidene fluoride), PFA (polyfluoroalkoxy), HDPE (high density polyethylene), PAS (polyarylsulfone), PES (polyether sulfone), PS (polysulfone), PP (polyproplyene) and PEEK (polyetheretherketone), or derivative thereof. In one or more of the foregoing and following embodiments, the filter membrane further includes a coating made of a polymer material. In one or more of the foregoing and following embodiments, a total number of the plurality of holes per square micron is in a range from 100 to 600. In one or more of the foregoing and following embodiments, two or more filter membranes having different average hole sizes from each other are provide in the filter device. In one or more of the foregoing and following embodiments, the filter housing includes an inlet and an outlet, and a filter membrane having a larger average hole size is located closer to the inlet than a filter membrane having a smaller average hole size.

According to another aspect of the present disclosure, in a method of manufacturing a filter membrane, a polymer layer is formed over a substrate, the polymer layer is patterned to form a plurality of through holes in the polymer layer, and the polymer layer with the plurality of through holes is removed from the substrate. In one or more of the foregoing and following embodiments, an average diameter of the plurality of through holes in in a range from 5 nm to 50 nm. In one or more of the foregoing and following embodiments, the patterning comprises a nano-imprint lithography method. In one or more of the foregoing and following embodiments, the patterning comprises a laser direct patterning. In one or more of the foregoing and following embodiments, in the patterning, a photo resist layer having a plurality of openings is formed over the polymer layer, the polymer layer is etched by using the photo resist layer, and the photo resist layer is removed. In one or more of the foregoing and following embodiments, in the patterning, a hard mask is placed over the polymer layer. The hard mask includes a plurality of through holes and is made of a ceramic material. The polymer layer is etched by plasma passing through the plurality of through holes formed in the hard mask.

According to another aspect of the present disclosure, in a method of manufacturing a filter membrane, a plurality of pillars are formed over a substrate, a polymer layer is formed over the substrate with the plurality of pillars, and the polymer layer having a plurality of through holes is removed from the substrate. In one or more of the foregoing and following embodiments, the polymer layer is formed by a deposition process. In one or more of the foregoing and following embodiments, the plurality of pillars are made of a polymer material. In one or more of the foregoing and following embodiments, the plurality of pillars are made of an inorganic material.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a filter membrane, the method comprising:
    forming a photo resist layer over a substrate;
    forming a polymer layer over the photo resist layer;
    patterning the polymer layer to form a plurality of through holes in the polymer layer;
    removing the polymer layer with the plurality of through holes from the substrate, thereby obtaining the filter membrane; and
    forming a coating layer made of a polymer material over the filter membrane to reduce diameters of the through holes, wherein:
    the patterning comprises:
        placing a hard mask over the polymer layer not to contact the polymer layer and at a distance of 1 µm to 1 mm from the polymer layer, the hard mask including a plurality of through holes and being made of a ceramic material;
        etching the polymer layer by plasma passing through the plurality of through holes formed in the hard mask; and
        an average diameter of the plurality of through holes after the diameters are reduced is in a range from 5 nm to 50 nm.

2. The method of claim 1, wherein an aspect ratio of plurality of through holes in the polymer layer is in a range from 2 to 10.

3. The method of claim 1, wherein the polymer layer includes one or more of PVDF (polyvinylidene fluoride), PFA (polyfluoroalkyl), PAS (polyarylsulfone), PES (polyether sulfone), and PEEK (polyetheretherketone), or derivatives thereof.

4. The method of claim 1, wherein the polymer material of the coating layer is different from the polymer layer.

5. The method of claim 4, wherein the polymer material of the coating layer is PTFE (polytetrafluoroethylene).

6. The method of claim 1, wherein a total number of the plurality of holes per square micron in the polymer layer is in a range from 100 to 600.

7. A method of manufacturing a filter membrane, the method comprising:
    forming a photo resist layer over a substrate;
    forming a polymer layer over the photo resist layer;
    placing a hard mask over the polymer layer not to contact the polymer layer and at a distance of 1 µm to 1 mm from the polymer layer, the hard mask including a plurality of through holes and being made of a ceramic material; and
    etching the polymer layer by plasma passing through the plurality of through holes formed in the hard mask, thereby forming a plurality of through holes in the polymer layer; and
    removing the polymer layer with the plurality of through holes from the substrate, thereby obtaining the filter membrane.

8. The method of claim 7, wherein the hard mask is made of ceramic.

9. The method of claim 7, wherein the hard mask is made of anodic aluminum oxide.

10. The method of claim 7, wherein the plasma is generated from one or more gases including $C_4F_8$, $SF_6$, $O_2$ or Ar.

11. The method of claim 7, further comprising attaching a fiber based filter membrane to the filter membrane.

12. The method of claim 11, wherein the fiber based filter membrane has random hole sizes.

13. A method of manufacturing a filter membrane, the method comprising:
    forming a sacrificial layer over a substrate;
    forming a polymer layer over the sacrificial layer;
    placing a hard mask over the polymer layer not to contact the polymer layer and at a distance of 1 µm to 1 mm from the polymer layer, the hard mask including a plurality of through holes and being made of a ceramic material; and
    etching the polymer layer by plasma passing through the plurality of through holes formed in the hard mask, thereby forming a plurality of through holes in the polymer layer; and
    removing the polymer layer with the plurality of through holes from the substrate, thereby obtaining the filter membrane.

14. The method of claim 13, further comprising forming a coating layer made of a polymer material over the filter membrane to reduce diameter of the through holes, wherein the coating material comprises a polymer.

15. The method of claim 14, wherein the polymer of the coating material is different from the polymer layer.

16. The method of claim 14, wherein the polymer of the coating material is a same as the polymer layer.

17. The method of claim 1, wherein a surface of the hard mask is coated with a coating material.

18. The method of claim 17, wherein the coating material is silicon oxide or silicon nitride.

19. The method of claim 1, wherein the polymer layer includes one or more of PFA (polyfluoroalkyl), PAS (polyarylsulfone), PES(polyether sulfone), or derivatives thereof.

20. The method of claim 7, wherein the polymer layer includes one or more of PFA (polyfluoroalkyl), PAS (polyarylsulfone), PES(polyether sulfone), or derivatives thereof.

* * * * *